(12) United States Patent
Lu et al.

(10) Patent No.: US 8,836,169 B2
(45) Date of Patent: Sep. 16, 2014

(54) CENTER-TAPPED SOLAR ARRAY AND POWER DISTRIBUTION SYSTEM FOR SAME

(75) Inventors: Cheng-Yi Lu, West Hills, CA (US); Kenneth John Metcalf, Simi Valley, CA (US)

(73) Assignee: Aerojet Rocketdyne of DE, Inc., Canoga Park, CA (US)

( * ) Notice: Subject to any disclaimer, the term of this patent is extended or adjusted under 35 U.S.C. 154(b) by 635 days.

(21) Appl. No.: 12/968,830

(22) Filed: Dec. 15, 2010

(65) Prior Publication Data
US 2012/0152301 A1 Jun. 21, 2012

(51) Int. Cl.
*H02J 1/00* (2006.01)
*H02J 3/00* (2006.01)
*H01L 31/042* (2014.01)
*H01L 31/02* (2006.01)

(52) U.S. Cl.
CPC ........... *H01L 31/02021* (2013.01); *Y02E 10/50* (2013.01); *H01L 31/0428* (2013.01)
USPC ............................................................ 307/82

(58) Field of Classification Search
USPC ............................................. 307/82; 136/244
See application file for complete search history.

(56) References Cited

U.S. PATENT DOCUMENTS

| 2005/0139259 A1* | 6/2005 | Steigerwald et al. ......... 136/293 |
| 2008/0150366 A1* | 6/2008 | Adest et al. ..................... 307/77 |
| 2011/0012435 A1 | 1/2011 | Cohen et al. |

* cited by examiner

*Primary Examiner* — Carlos Amaya
(74) *Attorney, Agent, or Firm* — Joel G. Landau

(57) ABSTRACT

A center-tapped solar array includes a plurality of series-connected solar cells connected between a positive terminal and a negative terminal for generating an output voltage. A center-tapped terminal connected to ground is connected to the plurality of series-connected solar cells at a midpoint between the positive and negative terminals. As a result, the positive terminal of the solar array has a positive voltage relative to ground greater than the center-tapped terminal and the negative terminal has a negative voltage relative to ground less than the center-tapped terminal.

8 Claims, 2 Drawing Sheets

CENTER-TAPPED SOLAR ARRAY AND POWER DISTRIBUTION SYSTEM FOR SAME

BACKGROUND

The present invention is related to solar arrays and power distribution systems used therewith.

Solar arrays typically include a plurality of individual solar cells arranged in a series-parallel connection to provide an output having the desired voltage and current characteristics. For example, a first plurality of solar cells connected in series (forming a column of series-connected solar cells) provide an output voltage equal to the sum of the voltage provided by each of the individual series-connected solar cells. The desired voltage magnitude is achieved by connecting a sufficient number of solar cells in series with one another. Connecting a plurality of the series-connected columns in parallel with one another provides the desired current characteristic of the solar array.

A typical solar array is a two-terminal device. The plurality of series-connected solar cells are connected between a positive terminal and a neutral or ground terminal. The voltage generated by the solar array is equal to the sum of the voltage generated by each of the plurality of series-connected solar cells. The voltage generated by the solar array is represented by the difference in potential between the positive terminal and the neutral terminal. In this arrangement, because the second terminal is connected to ground, the voltage at the positive terminal relative to ground is equal to the total voltage generated by the solar array.

In some high-voltage applications the voltage generated by the solar array and therefore provided at the positive terminal relative to ground may be quite large (e.g., 150 volts (V) or more). Voltages of these magnitudes relative to ground become problematic in some applications such as in space, wherein the voltage at the positive terminal interacts with the approximately neutral surrounding environment (e.g., free-floating electrons and/or ions). The potential difference between the positive terminal and the approximately neutral surrounding environment results in detrimental interactions between the solar array and the environment such as arc faults, surface charging and discharging, and/or ion sputtering. A consequence of these interactions is a negative impact on performance and/or life of the solar array.

SUMMARY

A center-tapped solar array includes a plurality of series-connected solar cells connected between a positive terminal and a negative terminal for generating an output voltage. A center-tapped terminal connected to ground is connected to the plurality of series-connected solar cells at a midpoint between the positive and negative terminals. As a result, the positive terminal of the solar array has a positive voltage relative to ground greater than the center-tapped terminal and the negative terminal has a negative voltage relative to ground less than the center-tapped terminal.

DETAILED DESCRIPTION

The present invention provides a center-tapped solar array and power distribution system. The center-tapped solar array is a three-terminal device having a positive terminal, a negative terminal and a center-tapped terminal connected to neutral. A plurality of series-connected solar cells are connected between the positive terminal and the negative terminal. The potential difference between the positive terminal and the negative terminal represents the output voltage of the solar array. The center-tapped terminal is connected to the plurality of series-connected solar cells at an approximate midpoint between the positive and negative terminals. As a result, although the difference in potential between the positive and negative terminals (i.e., the output voltage of the solar array) remains unchanged from a two-terminal device, the relative voltage at the positive and negative terminals with respect to ground is less than the voltage difference between the positive and negative terminals (i.e., the total output voltage of the solar array).

Figure 1:
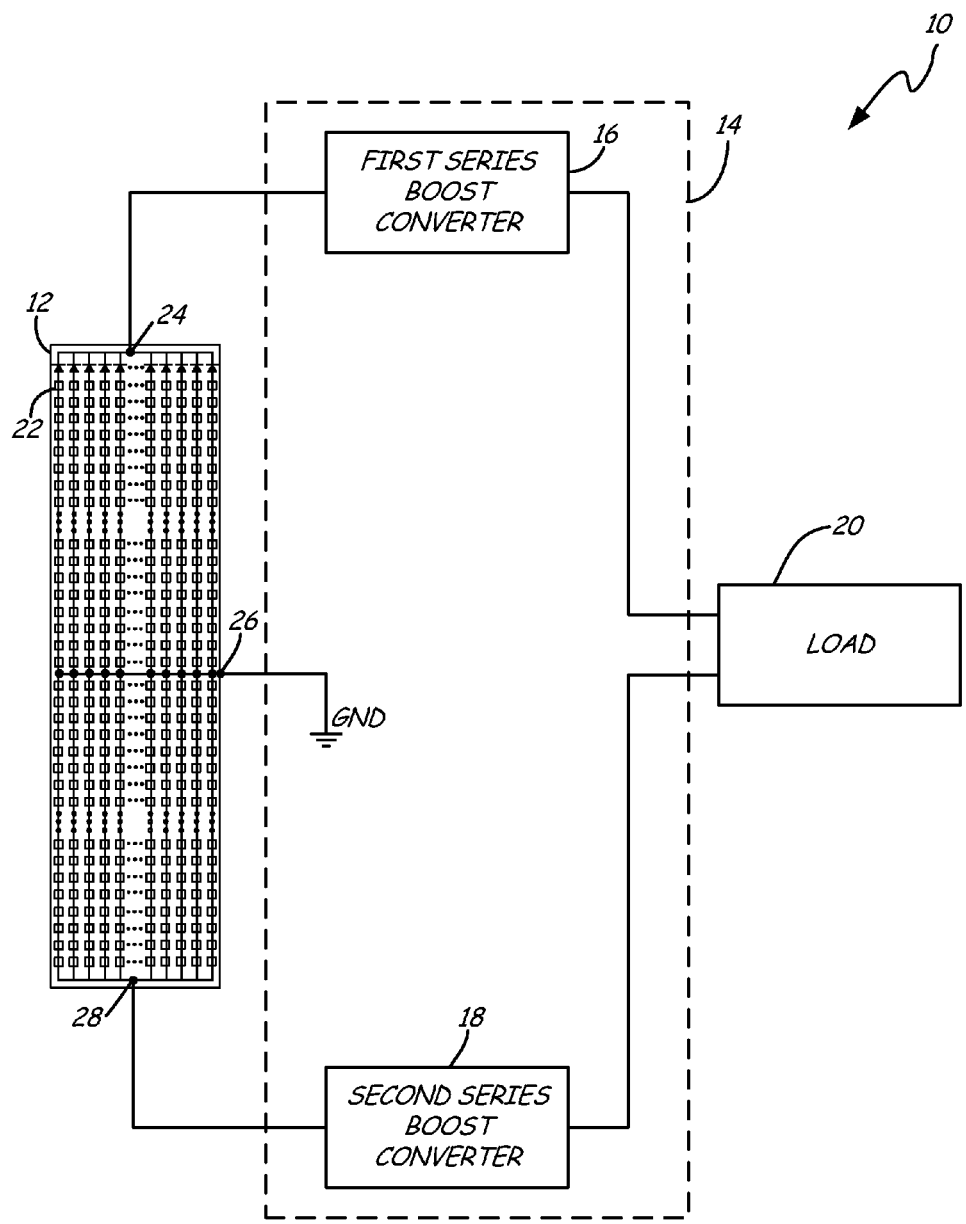
FIG. 1 is a block diagram illustrating a center-tapped solar array and distribution system according to an embodiment of the present invention.

FIG. 1 is a block diagram illustrating center-tapped solar array and distribution system 10 according to an embodiment of the present invention. System 10 includes solar array 12, power distribution system 14, which includes first series boost converter 16 and second series boost converter 18, and load 20. Solar array 12 includes a plurality of individual solar cells 22 connected in a series-parallel configuration. The embodiment shown in FIG. 1 includes six columns of series-connected solar cells. Each column includes a plurality of individual solar cells 22. The number of solar cells 22 included in each column determines the magnitude of the overall voltage provided by solar array 12. The number of columns determines the overall current made available by solar array 12. Depending on the application, the number of solar cells 22 may be increased or decreased to provide the desired voltage magnitude, and the number of columns may be increased or decreased to meet the output current requirements.

Solar array 12 is a three-terminal device that includes positive terminal 24, center-tapped terminal 26 and negative terminal 28. The plurality of series-connected solar cells are connected between positive terminal 24 and negative terminal 28. Center-tapped terminal 26 is connected to the approximate midpoint of solar array 12, and is tied to a neutral point such as ground. That is, in each column of solar cells, approximately half of the solar cells 22 are connected above center-tapped terminal 26 and approximately half of the solar cells 22 are connected below center-tapped terminal 26. The overall voltage $V_{array}$ provided by solar array 12 is the difference in potential between positive terminal 24 and negative terminal 28. The presence of center-tapped terminal 26 connected to a neutral point (e.g., ground) and the approximate midpoint of solar array 12 results in the voltage at positive terminal 24 being positive relative to ground (i.e., greater than the voltage at the center-tapped terminal) and the voltage at negative terminal 28 being negative relative to ground (i.e., less than the voltage at the center-tapped terminal).

For example, if the overall voltage $V_{array}$ provided by voltage array 12 is 300 V, the voltage at positive terminal 24 relative to ground would be equal to approximately 150V and the voltage at negative terminal 28 relative to ground would be equal to approximately −150V. Connecting center-tapped terminal 26 to ground and providing an equal number of solar cells above and below the center-tapped terminal ensures that the absolute value of the voltage at positive terminal 24 relative to ground is approximately equal to the absolute value of the voltage at negative terminal 28 relative to ground. In this way, the overall voltage or potential difference provided by solar array 12 satisfies voltage requirements of the application, but voltage differentials between one or more terminals and the approximately neutral environment is less than the total voltage made available by solar array 12.

In the embodiment shown in FIG. 1, positive voltage provided by positive terminal 24 of solar array 12 is provided to first series boost converter 16, which boosts and regulates the voltage to a desired output for supply to load 20. Likewise, negative voltage provided by negative terminal 28 of solar array 12 is provided to second series boost converter 18, which boosts and regulates the voltage to a desired output for supply to load 20. The voltage provided to load 20 is the potential difference between the positive output voltage provided by first series boost converter 16 and the negative output voltage provided by second series boost converter 18.

Figure 2:
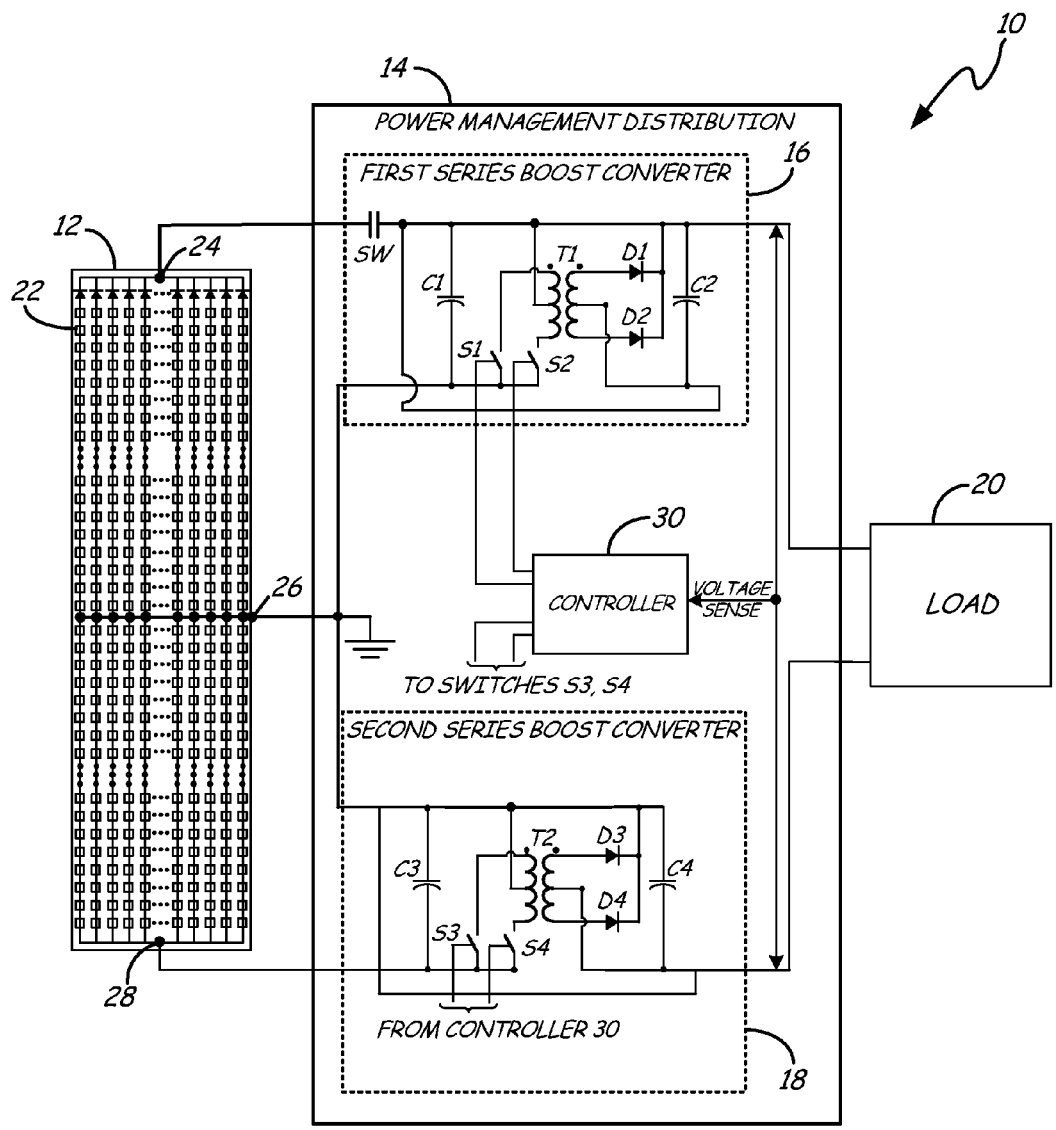
FIG. 2 is a block diagram illustrating in additional detail a center-tapped solar array and distribution system according to an embodiment of the present invention.

FIG. 2 is a block diagram illustrating in additional detail center-tapped solar array and distribution system 10 according to an embodiment of the present invention. In particular, first and second series boost converters 16 and 18 are implemented in the embodiment shown in FIG. 2 as series boost converters with a push-pull converter topology, regulated by controller 30. The push-pull converter topology shown is representative of a generic transformer isolated converter topology and other transformer isolated converter topologies could be used instead. Solar array 12 is once again a three-terminal device that includes positive terminal 24, center-tapped terminal 26, and positive terminal 28. Center-tapped terminal 26 is connected to ground, and provides a reference ground for first and second series boost converters 16, 18.

First series boost converter 16 includes transformer T1, capacitors C1 and C2, diodes D1 and D2, and switches S1 and S2 (collectively, referred to herein simply as 'switches' S1 and S2). Second series boost converter 18 likewise includes transformer T2, capacitors C3 and C4, diodes D3 and D4, and switches S3 and S4.

In the embodiment shown in FIG. 2, first and second series boost converters 16 and 18 boost the voltage provided by solar array 12. For example, in one embodiment solar array 12 generates at positive terminal 24 a positive voltage of 130V relative to ground and first series boost converter 16 boosts the positive voltage to 200V relative to ground. Second series boost converter 18 likewise boosts a negative voltage provided by solar array 12 at negative terminal 28 from −130V, relative to ground, to −200V. In this way, power management and distribution system 14 provides a voltage (i.e., potential difference between the outputs of series boost converters 16 and 18) of 400V to load 20.

In the embodiment provided in FIG. 2, the positive voltage provided at the positive terminal 24 of solar array 12 is provided to the cathode of capacitor C2 (i.e., passed-through directly to the output of first series boost converter 16). The pass-through voltage provided by the positive terminal is boosted by switches S1 and S2, transformer T1 and diodes D1 and D2 to provide a boost voltage to the anode of capacitor C2 that is summed with the pass-through voltage provided to the cathode of capacitor C2. In particular, positive voltage provided by the positive terminal 24 of solar array 12 is connected to a center-tap on the primary side of transformer T1. Capacitor C1 maintains a smooth direct current (DC) voltage supply at the primary winding of transformer T1. Switches S1 and S2 are alternately turned On and Off by controller 30 to create an alternating current (AC) voltage through the primary winding of transformer T1. A proportional AC voltage is generated on the secondary winding of transformer T1 having a magnitude determined by the duty cycles of switches S1 and S2. The AC voltage generated on the secondary winding of transformer T1 is rectified by diodes D1 and D2 and applied to the anode of capacitor C2. In this way, the positive voltage provided at positive terminal 24 of solar array 12 is boosted and regulated by first series boost converter 16.

Second series boost converter 18 operates in the same manner to boost the negative voltage provided at negative terminal 28. The negative voltage provided at negative terminal 28 is passed through to the output of second series boost converter 18 and provided to the anode of capacitor C4. The negative pass-through voltage is boosted by switches S3 and S4, transformer T2 and diodes D3 and D4. Switches S3 and S4 are selectively turned On and Off by controller 30 to generate an AC voltage through the primary winding of transformer T2. Capacitor C3 maintains a smooth DC voltage at the primary side of transformer T2. A proportional AC voltage is generated on the secondary winding of transformer T2 having a magnitude determined by the duty cycles of switches S3 and S4. Diodes D3 and D4 rectify the AC waveform and provide a boost voltage to the anode of capacitor C4. The output of second series boost converter 18 is the sum of the pass-through voltage and the boost voltage provided by transformer T2.

In the embodiment shown in FIG. 2, controller 30 monitors the voltage provided to load 20 and selectively controls the On/Off state of switches S1, S2, S3 and S4 to generate a desired output voltage. In other embodiments, controller 30 may monitor the output voltages provided by first and second series boost converters 16 and 18 separately with respect to ground in order to balance the voltage relative to ground of each boost converter.

In an exemplary embodiment solar array 12 generates a potential difference of 260 V (voltage difference between the positive and negative terminals). Due to the presence of center-tap 26 located at the midpoint of solar array 12, a positive voltage of approximately 130 V, relative to ground, is provided at positive terminal 24 and a negative voltage of approximately −130 V, relative to ground, is provided at negative terminal 28. First series boost converter 16 boosts the positive voltage provided at positive terminal 24 to 200 V relative to ground, and second series boost converter 18 boosts the negative voltage provided at negative terminal 28 to −200 V relative to ground. The potential difference between the output of first series boost converter 16 and second series boost converter 18 is therefore approximately 400 V, even though the voltage at positive terminal 24 and negative terminal 28 relative to ground is equal to approximately 130 V. The voltages described herein are merely exemplary and are based on present limitations of attainable output voltage by solar arrays before damage occurs to the arrays.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A solar array for a power distribution system comprising:
   a plurality of series-connected solar cells connected in parallel, each of the plurality of series-connected solar cells connected between a positive terminal and a negative terminal for generating a voltage differential between the positive terminal and the negative terminal; and a center-tapped terminal electrically connected to ground and to each of the series-connected solar cells at a midpoint between the positive and negative terminals, the positive terminal having a positive voltage relative to ground greater than the center-tapped terminal and the negative terminal having a negative voltage relative to ground less than the center-tapped terminal;

a first series boost converter that boosts the voltage at the positive terminal to generate a positive boost voltage; and a second series boost converter that boosts the voltage at the negative terminal to generate a negative boost voltage, wherein a voltage differential between the positive boost voltage and the negative boost voltage is greater than the voltage differential between the positive terminal and the negative terminal.

2. The solar array of claim 1, wherein an absolute value of the voltage at the positive terminal relative to ground is approximately equal to an absolute value of the voltage at the negative terminal relative to ground.

3. The solar array of claim 1, wherein the positive terminal has a positive voltage relative to ground is equal to or less than 180 volts and the negative terminal has a negative voltage relative to ground is equal to or less than 180 volts, wherein the voltage differential between the positive terminal and the negative terminal is equal to the sum of the positive voltage and the negative voltage.

4. The solar array of claim 1, wherein the first series boost converter and the second series boost converter are pass-through series boost regulators.

5. A power generation system comprising:

a solar array having a plurality of solar cells connected in series between a positive terminal and a negative terminal for generating a voltage differential between the positive terminal and the negative terminal, and a center-tapped terminal electrically connected to ground and to the plurality of series-connected solar cells at a midpoint between the positive and negative terminals, the positive terminal having a positive voltage relative to ground greater than the center-tapped terminal and the negative terminal having a negative voltage relative to ground less than the center-tapped terminal;

a first series boost converter connected to boost the positive voltage provided at the positive terminal to a positive boost voltage; and a second series boost converter connected to boost the negative voltage provided at the negative terminal to a negative boost voltage, the voltage differential between the positive boost voltage and the negative boost voltage being greater than the voltage differential between the positive terminal and the negative terminal.

6. The power generation system of claim 5, wherein an absolute value of the voltage at the positive terminal relative to ground is approximately equal to an absolute value of the voltage at the negative terminal relative to ground.

7. The power generation system of claim 5, wherein the first series boost converter and the second series boost converter are pass-through series boost converters.

8. The power generation system of claim 5, wherein the positive terminal has a positive voltage relative to ground is equal to or less than 180 volts and the negative terminal has a negative voltage relative to ground is equal to or less than 180 volts, wherein the voltage differential between the positive terminal and the negative terminal is equal to the sum of the positive voltage and the negative voltage.

* * * * *